(12) United States Patent
Hung et al.

(10) Patent No.: US 6,914,826 B2
(45) Date of Patent: Jul. 5, 2005

(54) FLASH MEMORY STRUCTURE AND OPERATING METHOD THEREOF

(75) Inventors: Chih-Wei Hung, Hsin-chu (TW); Da Sung, Hsinchu (TW); Cheng-Yuan Hsu, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/709,507

(22) Filed: May 11, 2004

(65) Prior Publication Data

US 2004/0217412 A1 Nov. 4, 2004

Related U.S. Application Data

(62) Division of application No. 10/249,363, filed on Apr. 3, 2003, now Pat. No. 6,774,428.

(30) Foreign Application Priority Data

Dec. 20, 2002 (TW) ........................................ 91136786 A

(51) Int. Cl.$^7$ .............................................. G11C 16/04
(52) U.S. Cl. ............................ 365/185.28; 365/185.29; 365/185.26
(58) Field of Search ......................... 365/185.2, 185.33, 365/185.26, 185.29, 185.14

(56) References Cited

U.S. PATENT DOCUMENTS 6,026,025 A * 2/2000 Tanaka et al. ......... 365/185.22

* cited by examiner

*Primary Examiner*—Thong Q. Le
(74) *Attorney, Agent, or Firm*—Jianq Chyun IP office

(57) ABSTRACT

A flash memory structure is provided. The flash memory structure includes a P-type substrate, a deep N-well set up within the P-type substrate, a P-well set up within the deep N-well, a pair of gate structures set up over the substrate, a select gate set up between the pair of gate structure and N-type source/drain regions in the P-well on each side of the gate structure. Since each pair of neighboring gate structure uses a common gate, the level of integration of device can be increased.

9 Claims, 10 Drawing Sheets

FLASH MEMORY STRUCTURE AND OPERATING METHOD THEREOF

CROSS REFERENCE TO RELATED APPLICATIONS

This application is a divisional of a prior application Ser. No. 10/249,363, filed Apr. 03, 2003 now U.S. Pat. No. 6,774,428.

BACKGROUND OF INVENTION

1. Field of Invention

The present invention relates to a memory device. More particularly, the present invention relates to a flash memory structure and operating method thereof.

2. Description of Related Art

Flash memory is a device having multiple data access, read-out and erase capability. Furthermore, data stored within a flash memory will be retained even after power to the device is cut off. Hence, flash memory has become one of the most popular non-volatile memories deployed inside personal computers and electronic equipment.

A typical flash memory device has a floating gate and a control gate fabricated using doped polysilicon. The control gate is set up over the floating gate with the two layers separated from each other by a dielectric layer. The floating gate is isolated from an underlying substrate by a tunneling oxide layer, thereby forming a stack gate flash memory structure.

To write data into the flash memory, a bias voltage is applied to the control gate and the source/drain region and hence electrons are injected into the floating gate. To read data from the flash memory, an operating voltage is applied to the control gate. With the charging condition inside the floating gate affecting the conductive state of the channel, a value of "0" or "1" can be determined. To erase data from the flash memory, relative potential of the substrate, the drain (source) region or the control gate is raised. Through action caused by a tunneling effect, trapped electrons inside the floating gate penetrate through the tunneling oxide layer into the substrate or the drain (source) terminal (the so-called substrate erase or drain (source) side erase) or penetrate through the dielectric layer into the control gate.

However, the quantity of electrons bled out from the floating gate is difficult to control in an operation to erase data from the flash memory. If an excessive amount of electrons flows out of the floating gate, the floating gate will contain a net positive charge leading to an over-erase condition. If such over-erase phenomena is severe, the channel underneath the floating gate may conduct without the application of an operating voltage resulting in erroneous reading. To reduce the over-erasing problem, most flash memory has a split-gate design. One major aspect of a split-gate design is the addition of a select gate (or erase gate) on the sidewall of the control gate and the floating gate and above the substrate besides the control gate and the floating gate. The selective gate (or erase gate) is isolated from the control gate, the floating gate and the substrate through a gate dielectric layer. When over-erase is severe so that the channel underneath the floating gate is conductive even without applying an operating voltage to the control gate, the channel underneath the select gate still remains shut. In other words, the source/drain region is non-conductive and erroneous reading from the flash memory is prevented. Nevertheless, a split-gate structure demands a larger area and hence each memory cell has a larger dimension compared with a conventional stack gate flash memory. That means, overall level of integration has to be reduced. To reduce the size of each memory cell, a dual-cell flash memory structure with two cells using the same select gate is invented.

FIG. 1 is a schematic cross-sectional view of a conventional dual-cell flash memory structure. The dual-cell flash memory structure in FIG. 1 includes a first memory cell 101a and a second memory cell 101b over a substrate 100. The first memory cell 101a has a gate structure 102a that includes a tunneling oxide layer 104a, a floating gate 106a, a gate dielectric layer 108a, a control gate 110a and a cap layer 112a. Similarly, the second memory cell 101b has a gate that includes a tunneling oxide layer 104b, a floating gate 106b, a gate dielectric layer 108b, a control gate 110b and a cap layer 112b. Spacers 114a and 114b are attached to the sidewalls of the first gate structure 102a and the second gate structure 102b respectively. Source/drain regions 116a and 116b are located in the substrate 100 on opposite sides of the first gate structure 102a and the second gate structure 102b. A select gate 118 not only covers the gate structures 102a, 102b but also extends from one source/drain region 116a to another source/drain region 116b.

To program data into the memory cell 101a of the dual-cell flash memory structure, the memory cell 101b serves as a channel transistor. A bias voltage of 10V is applied to the control gate 110a; a bias voltage of 10V is applied to the control gate 110b so that the channel underneath the memory cell 101b is opened; a bias voltage of 2V is applied to the select gate 118; a bias voltage of 2V is applied to the source/drain region 116a and a bias voltage of 0V is applied to the source/drain region 116b. With this voltage setup, electrons moving from the source/drain region 116b towards the source/drain region 116a are accelerated by the intense electric field close to the source/drain region 116a to generate hot electrons. Kinetic energy of these electrons overcomes the energy barrier in the tunneling oxide layer 104a, and together with the high positive bias voltage applied to the control gate 110a, the hot electrons are injected into the floating gate 106a from the source/drain region 116a. Hence, the memory cell 101a is programmed. Similarly, to program data into the memory cell 101b of the dual-cell flash memory structure, the memory cell 101a serves as a channel transistor. A bias voltage of 10V is applied to the control gate 110b; a bias voltage of 10V is applied to the control gate 110a so that the channel underneath the memory cell 101a is opened; a bias voltage of 2V is applied to the select gate 118; a bias voltage of 2V is applied to the source/drain region 116b and a bias voltage of 0V is applied to the source/drain region 116a. With this voltage setup, electrons moving from the source/drain region 116a towards the source/drain region 116b are accelerated by the intense electric field close to the source/drain region 116b to generate hot electrons. Kinetic energy of these electrons overcomes the energy barrier in the tunneling oxide layer 104b, and together with the high positive bias voltage applied to the control gate 110b, the hot electrons are injected into the floating gate 106b from the source/drain region 116b. Hence, the memory cell 101b is programmed.

In the aforementioned method of programming a dual-cell flash memory structure, if the memory cell 101b is programmed immediately after programming the memory cell 101a, the memory cell 101b may be affected by the programmed memory cell 101a leading to a lowering of programming current. Hence, programming speed of the memory cell 101b will be lower than the memory cell 101a. In other words, the dual-cell flash memory will have an unsymmetrical programming operation resulting in a slower overall operating speed.

SUMMARY OF INVENTION

Accordingly, one object of the present invention is to provide a flash memory structure and an operating method thereof for increasing the level of integration of the memory device.

A second object of this invention is to provide a flash memory structure and an operating method thereof for eliminating unsymmetrical programming in memory cells so that memory cell current can be reduced and overall operating speed of the memory device can be increased.

A third object of this invention is to provide a flash memory structure and an operating method that can prevent over-erasing memory cells.

To achieve these and other advantages and in accordance with the purpose of the invention, as embodied and broadly described herein, the invention provides a flash memory device structure. The flash memory device structure includes a first conductive type substrate, a second conductive type first well, a first conductive type second well, a pair of gate structures, a select gate and a pair of first conductive type source/drain regions. The second conductive type first well is located within the first conductive type substrate. The first conductive type second well is located within the second conductive type first well. The pair of gate structures is positioned over the first conductive type substrate. The select gate is positioned between the pair of gate structures. The pair of first conductive type source/drain regions is located within the first conductive type second well on the opposite side of the respective gate structures.

Each gate structure has a floating gate, a tunneling oxide layer, a control gate, a gate dielectric layer, a first spacer and a second spacer. The floating gate is set up over the first conductive type substrate. The tunneling oxide layer is set up between the floating gate and the first conductive type substrate. The control gate is set up over the floating gate. The gate dielectric layer is set up between the control gate and the floating gate. The first spacer is set up on the sidewalls and upper surface of the control gate. The second spacer is set up on the sidewalls of the floating gate. The tunneling oxide layer may extend into the gap between the select gate and the first conductive type substrate.

Since two neighboring gate structures (memory cells) uses a single select gate in this invention, corresponding level of integration for the flash memory devices is increased.

This invention also provides a method of operating a flash memory device. The flash memory device includes a P-type substrate, a deep N-well, a P-well, a first memory cell, a second memory cell, a select gate, a first source/drain region and a second source/drain region. The deep N-well is embedded within the P-type substrate. The P-well is embedded within the deep N-well. The first memory cell and the second memory cell are set up over the P-type substrate. The first memory cell has a first control gate and the second memory cell has a second control gate. The select gate is set up between the first memory cell and the second memory cell. The first source/drain region and the second source/drain region are set up in the P-well on the opposite side of the first memory cell and the second memory cell. Both the first source/drain region and the second source/drain region are N-type conductive layers. To program the first memory cell of the flash memory device, a first positive voltage is applied to the first control gate and a first negative voltage is applied to the P-well so that the select gate is at a ground potential and the first source/drain region and the second source/drain region are in a floating state. Through the voltage setup, the first memory cell is programmed via the F-N tunneling effect. To read data from the first memory cell of the flash memory device, a second positive voltage is applied to the select gate and the first control gate, a third positive voltage is applied to the second control gate, a fourth positive voltage is applied to the second source/drain region and a ground voltage is applied to the first source/drain region and the P-well. To erase data from the memory cells on the same word line, a fifth positive voltage is applied to the select gate, zero voltage is applied to the first control gate and the second control gate, the first source/drain region and the second source/drain region is set to a floating state so that F-N effect is able to wipe out the data on an entire page of flash memory devices.

The aforementioned method of operating the flash memory device may further include applying a first positive voltage to the second control gate and a first negative voltage to the P-well when the second memory cell in the flash memory device is programmed. Hence, the select gate is at a ground potential and both the first source/drain region and the second source/drain region remain in a floating state so that the second memory cell is again programmed through the F-N tunneling effect.

In the flash memory device of this invention, an isolating P-well is formed inside the deep N-well. By applying a suitable voltage to the control gate and the isolated P-well, F-N tunneling effect can be utilized to force electrons in the substrate (the isolated P-well) through the tunneling oxide layer into the floating gate. Thus, there is very little effect on the programming of data into the second memory cell immediately after programming data into the first memory cell. In other words, unsymmetrical programming problem in the memory cells is prevented.

In addition, the F-N tunneling effect is utilized to program the channel flash memory device. Since F-N tunneling has very high electron injection efficiency, memory cell current required for programming can be reduced and operating speed can be increased. Furthermore, both programming and erasing are carried out using the F-N tunneling effect, which consumes very little current. Therefore, overall power consumption of the memory device is reduced. Moreover, the method can also be applied to program/erase the data in parallel on a large page.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
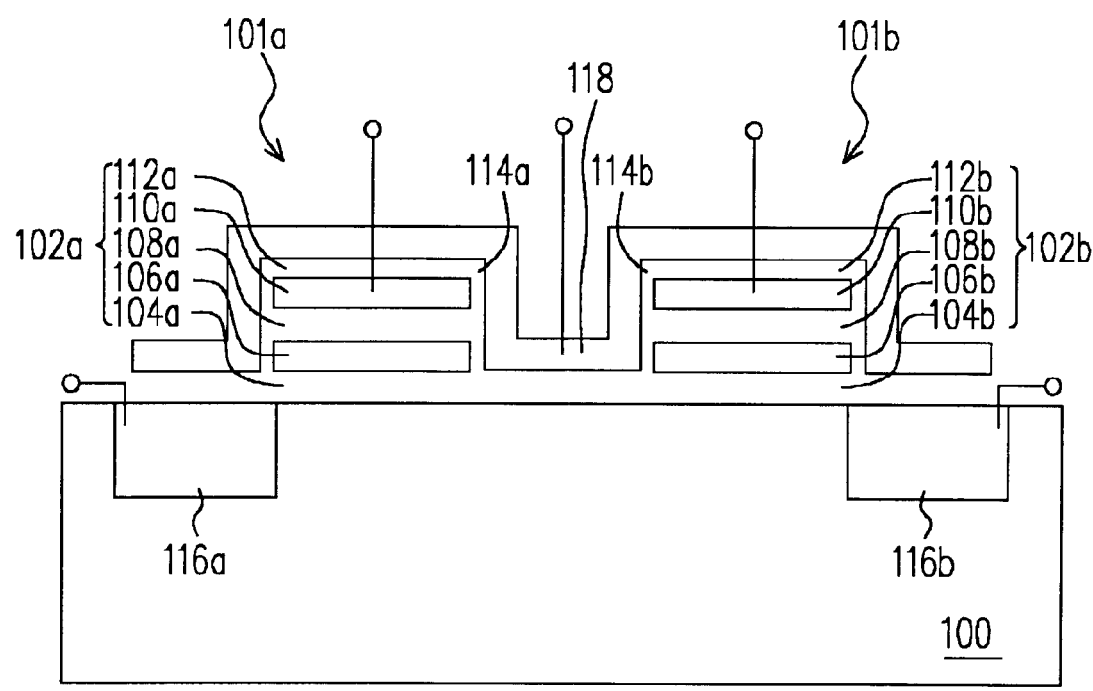
FIG. 1 is a schematic cross-sectional view of a conventional dual-cell flash memory structure.

Reference will now be made in detail to the present preferred embodiments of the invention, examples of which are illustrated in the accompanying drawings. Wherever possible, the same reference numbers are used in the drawings and the description to refer to the same or like parts.

Figure 2:
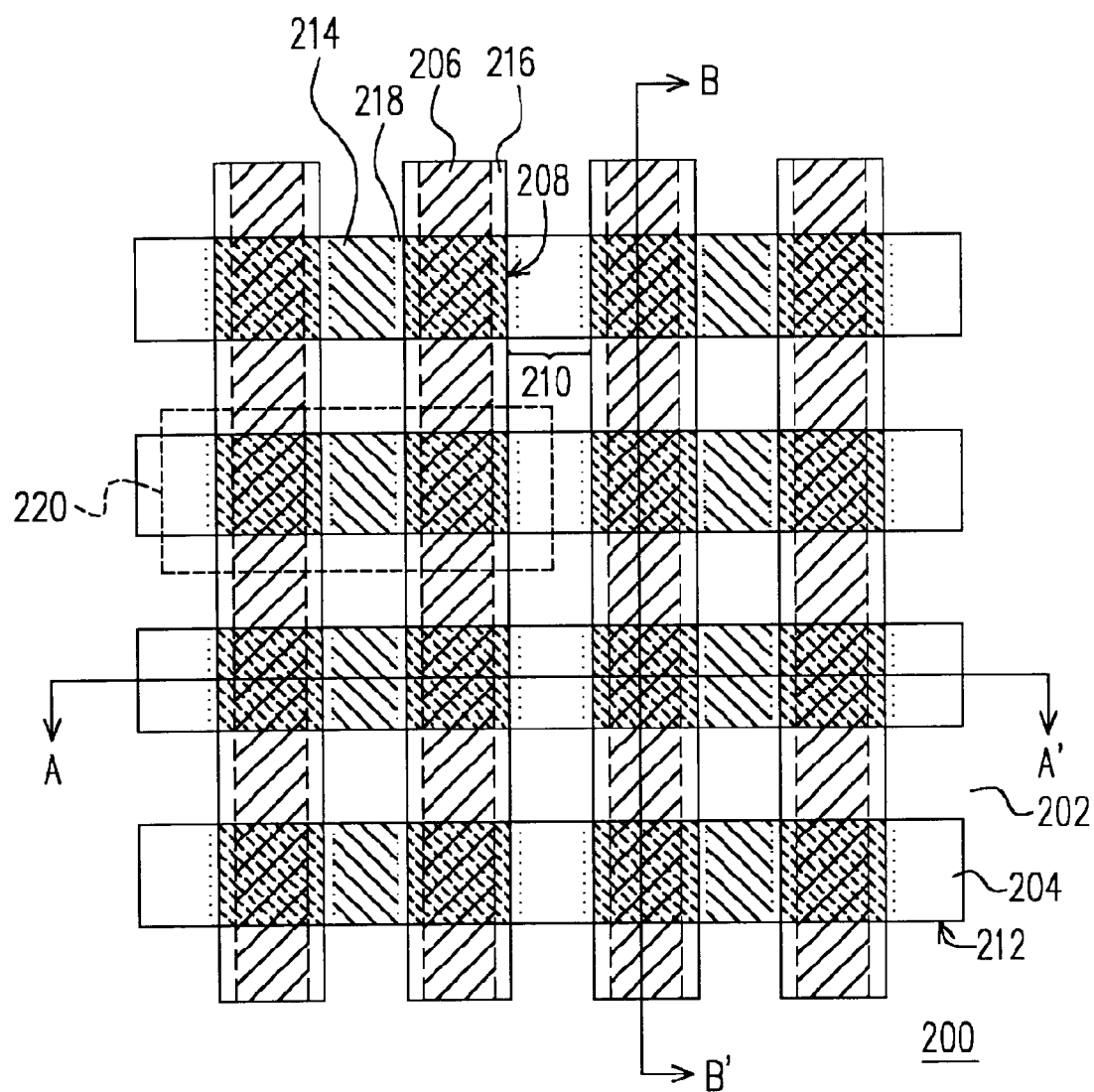
FIG. 2 is a top view of a flash memory according to this invention.

FIG. 2 is a top view of a flash memory according to this invention. As shown in FIG. 2, the flash memory at least comprises of a substrate 200, a device isolation structure 202, an active region 204, a control gate 206 (word line), a floating gate 208, an N-type source/drain region 210, a P-well 312 and a select gate 214. The select gate 214 is separated from the control gate 206 and the floating gate 208 by an insulating layer (spacer) 216 and another insulating layer (spacer) 218. The substrate 200 has a deep N-well (not shown) and the P-well 212 is set up over the deep N-well. The device isolation structure 202 is set up within the substrate 200 for patterning the active region 204 so that the P-well 212 is located inside the active region 204. The control gate 206 is set up within the substrate perpendicular to the active region 204. The floating gate 208 is set up underneath the substrate 200 where the control gate 206 (word line) crosses over the active region 204. In the same active region 204, every pair of neighboring memory cells 220 constitutes a group having a select gate 214 set up between them. The N-type source/drain region 210 is set up in the P-well 212 on both sides of each memory cell. All the select gates 214 within the same active region 204 are electrically connected to a select gate line (not shown). All the different active regions 204 along the same column of N-type source/drain regions 210 are electrically connected through a bit line (not shown).

Figure 3A:
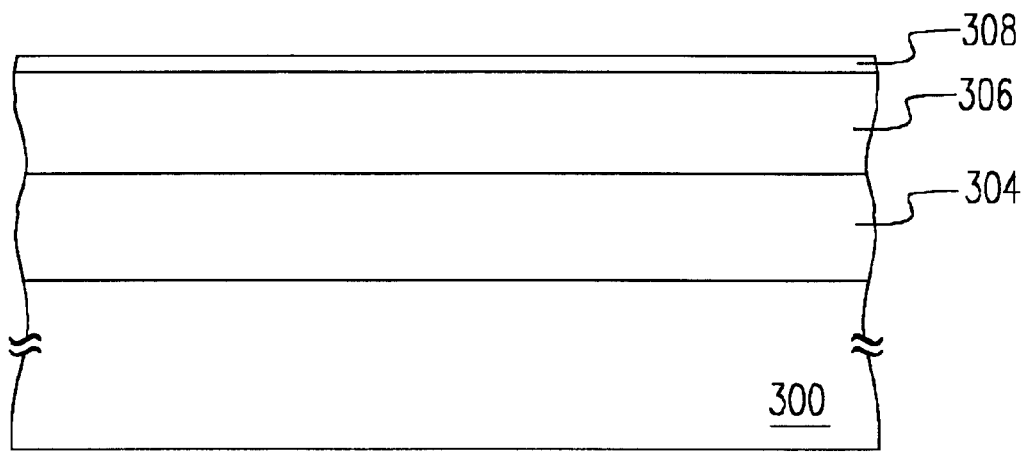
FIGS. 3A to 3F are cross-sectional views along line A–A' of FIG. 2 showing the steps for fabricating the flash memory of this invention.

FIGS. 3A to 3F are cross-sectional views along line A–A' of FIG. 2 showing the steps for fabricating the flash memory of this invention. FIGS. 4A to 4D are cross-sectional views along line B–B' of FIG. 2 showing the steps for fabricating the flash memory of this invention. First, as shown in FIGS. 3A and 4A, a P-type substrate 300 with device isolation structures 302 thereon is provided. The device isolation structures 302 form a series of parallel strips across the substrate 300 to pattern out active regions. The device isolation structures 302 are formed, for example, by conducting local oxidation (LOCOS) or carrying out the steps necessary for forming a shallow trench isolation (STI) structure. Each device isolation structure 302 must have a depth capable of isolating the subsequently formed P-well regions 306. Thereafter, deep N-well regions 304 are formed in the P-type substrate 300 and then P-well regions 306 are formed within the respective deep N-well regions 304. The P-well regions 306 must have a depth smaller than the isolation structures 302. Next, an oxide layer 308 is formed over the P-type substrate 300 to serve as a tunneling oxide layer. The oxide layer 308 is formed, for example, by conducting a thermal oxidation.

Figure 3B:
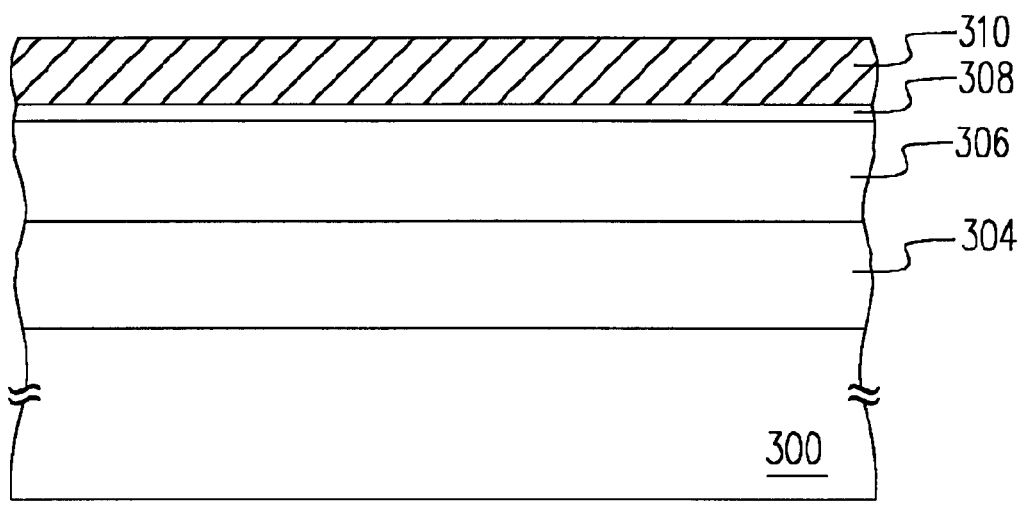
Figure 4A:
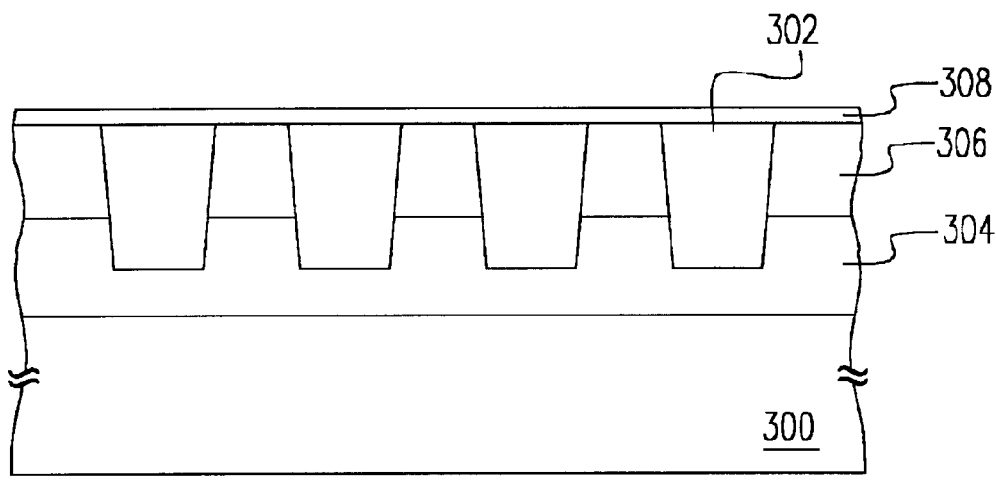
FIGS. 4A to 4D are cross-sectional views along line B–B' of FIG. 2 showing the steps for fabricating the flash memory of this invention.
Figure 4B:
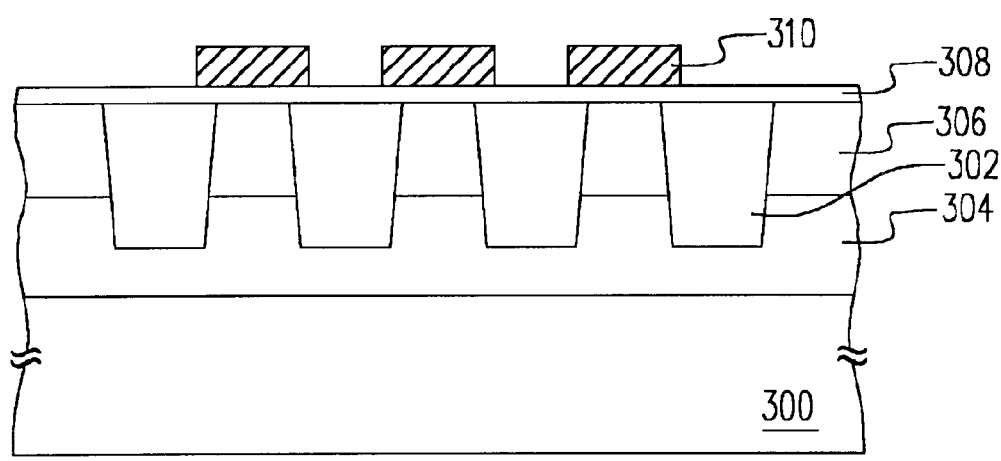

As shown in FIGS. 3B and 4B, a conductive layer (not shown) such as a doped polysilicon layer is formed over the oxide layer 308. The conductive layer is formed, for example, by conducting a chemical vapor deposition to form an undoped polysilicon layer over the oxide layer 308 and then implanting ions into the polysilicon layer. The conductive layer has a thickness of about 200 Å and dopants such as arsenic ions are implanted into the polysilicon layer. Thereafter, the conductive layer is patterned to form a conductive layer 310 that exposes a portion of the upper surface of the device isolation structures.

Figure 3C:
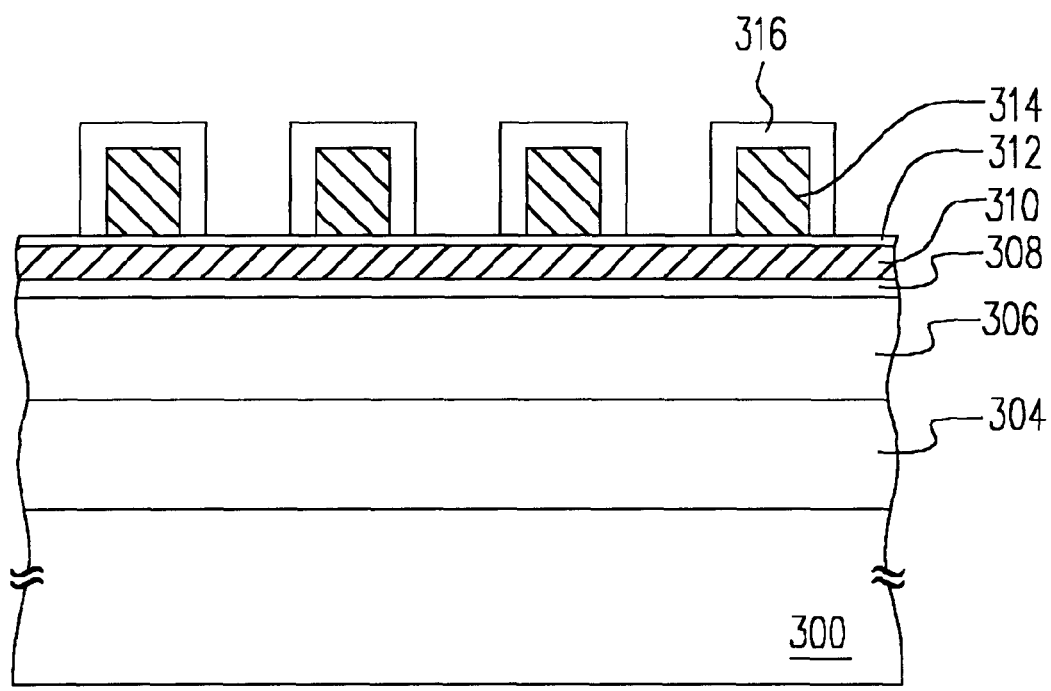
Figure 4C:
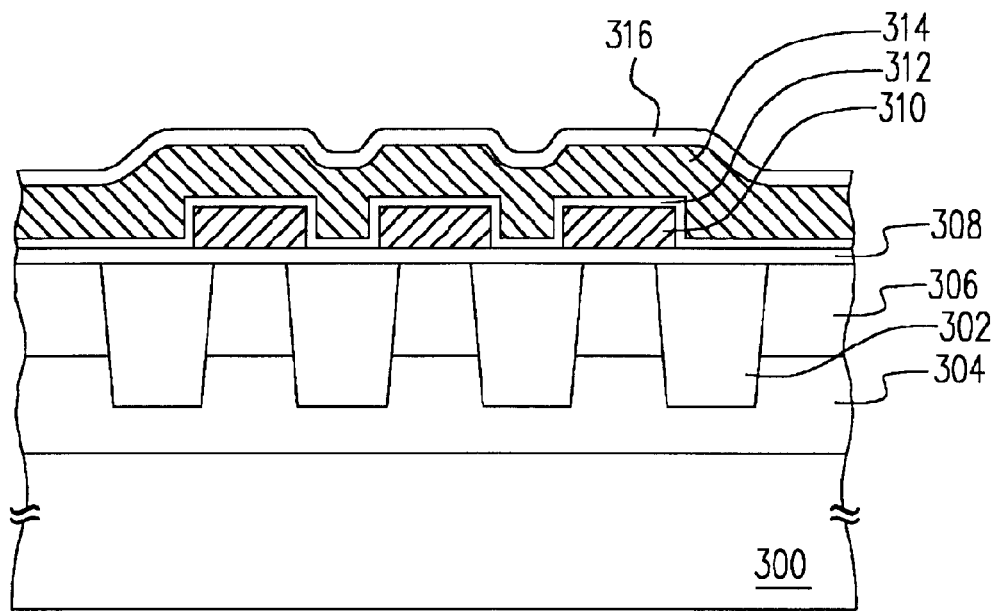

As shown in FIGS. 3C and 4C, a dielectric layer 312 and another conductive layer (not shown) are sequentially formed over the P-type substrate 300. Using a mask, the conductive layer is patterned to form conductive layers 314 that serve as control gates. The dielectric layer 312 is a composite layer such as an oxide/nitride/oxide layer formed, for example, by conducting a low-pressure chemical vapor deposition. Obviously, the dielectric layer 312 can be a silicon oxide layer or an oxide/nitride composite layer. The conductive layer 314 can be a doped polysilicon layer formed, for example, by conducting a chemical vapor deposition with in-situ dopant implantation.

After removing the mask layer, an insulating layer 316 is formed on the sidewalls and the upper section of the conductive layers 314. The insulating layer 316 can be a silicon oxide layer formed, for example, by conducting a thermal oxidation.

Figure 3D:
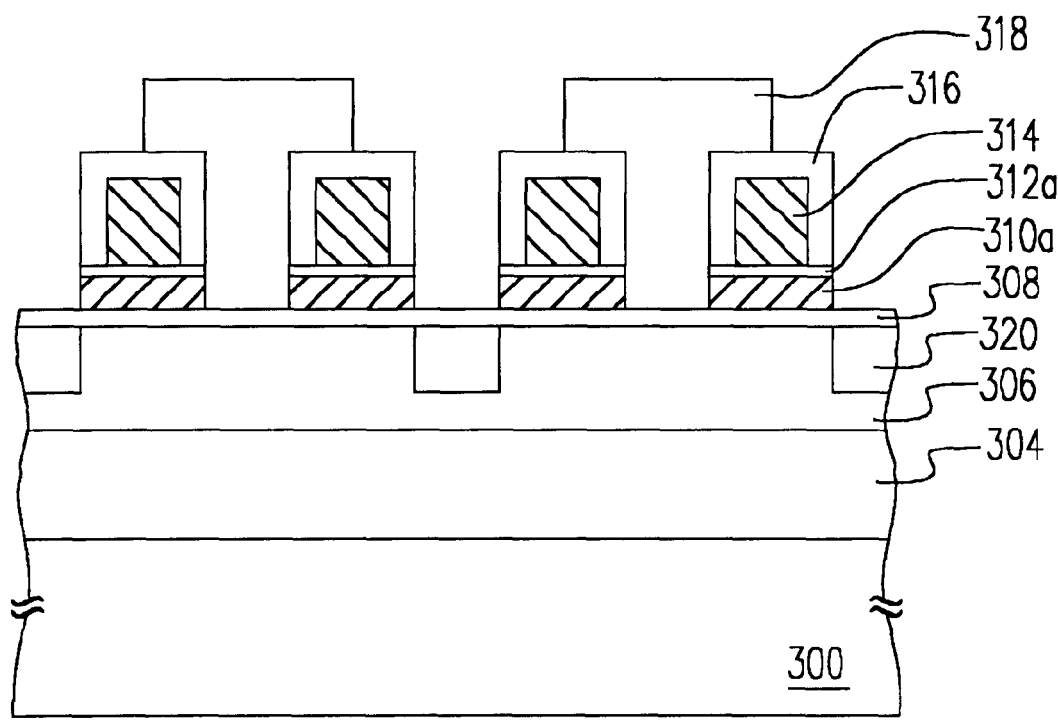
Figure 4D:
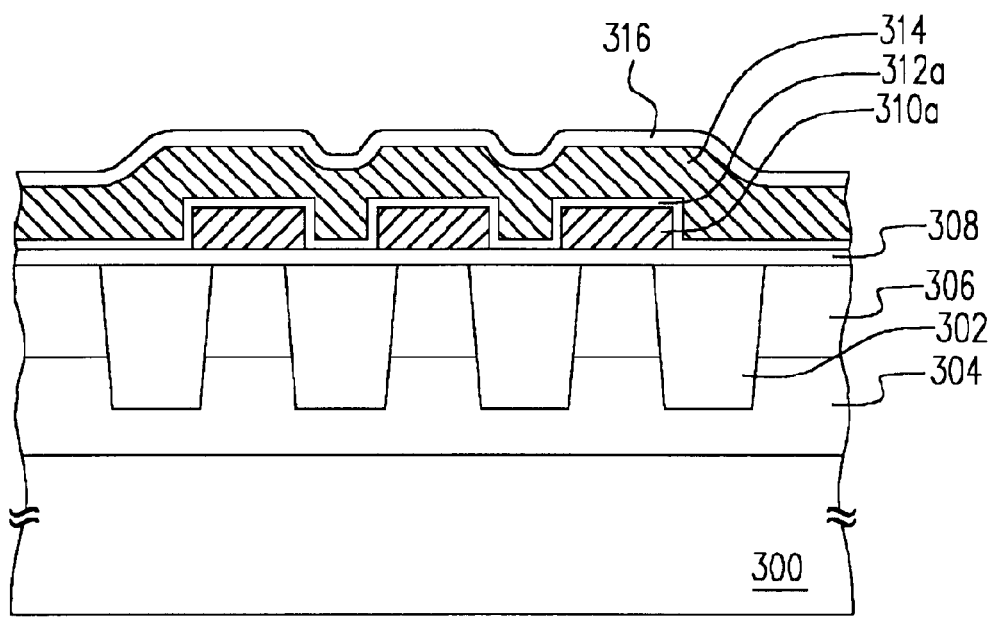

As shown in FIGS. 3D and 4D, the dielectric layer 312 and the conductive layer 310 are patterned using the conductive layers 314 and the insulation layers 316 as a mask to form dielectric layers 312a and conductive layers 310a. The conductive layers 310a serve as floating gates. In other words, the conductive layer (control gate) 314, the dielectric layer 312a, the conductive layer (control gate) 310a and the oxide layer 308 (tunneling oxide layer) together constitute a gate structure. Thereafter, a patterned mask layer 318 is formed over the entire substrate 300. The patterned mask layer 318 exposes areas for forming the source/drain regions 320. An ion implantation is carried out using the patterned mask layer 318 to form a source/drain region 320 in the P-well region 306 of the substrate 300 on one side of the gate structure. Each pair of neighboring gate structures can be regarded as a single gate structure unit. In each gate structure unit, a select gate is formed between the individual gate structure and the source/drain regions 320 are formed in the substrate on each side of the gate structure unit. Since the B–B' section of FIG. 2 is identical in subsequent processing steps, only the A–A' section of FIG. 2 is displayed in the following.

Figure 3E:
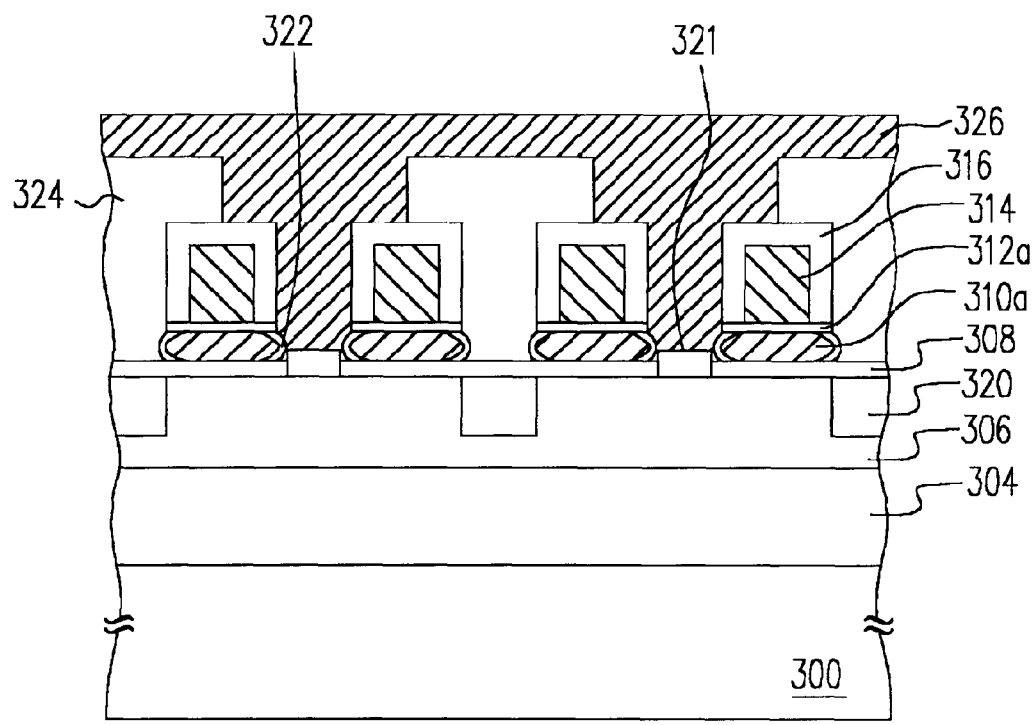

As shown in FIG. 3E, the patterned mask layer 318 is removed. A select gate oxide layer 321 is formed over the substrate 300 between the gate structures and an insulating layer (spacer) 322 is formed on the sidewalls of the conductive layers 310a (floating gates). The select gate oxide layer 321 and the insulating layer (spacer) 322 can be silicon oxide layer formed, for example, by conducting thermal oxidation. The select gate oxide layer 321 has a thickness of about 250 Å. Thereafter, another patterned mask layer 324 is formed over the substrate 300 covering the source/drain regions 320 but exposing the area for forming the select gate. A conductive layer 326 is formed over the substrate 300. The conductive layer 326 can be a doped polysilicon layer formed, for example, by conducting a chemical vapor deposition with in-situ dopant implantation.

Figure 3F:
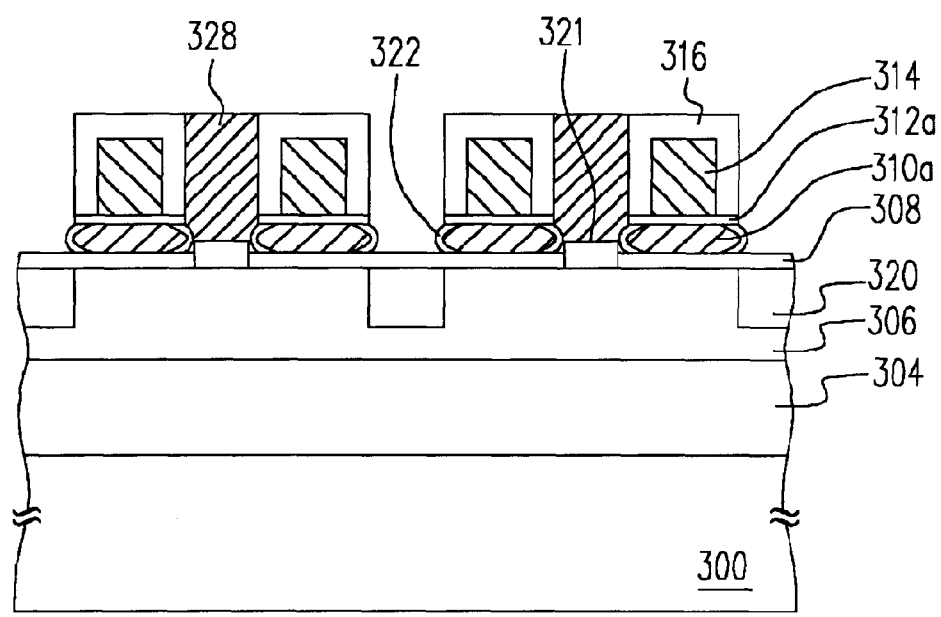

As shown in FIG. 3F, a portion of the conductive layer 326 and the patterned mask layer 326 are removed to expose the upper surface of the insulating layer 316 so that a select gate 328 is formed between the gate structures. Thereafter, the patterned mask layer is removed. Since subsequent processing steps for completing the fabrication should be familiar to those skilled in the technologies, detailed description is omitted here.

Figure 5:
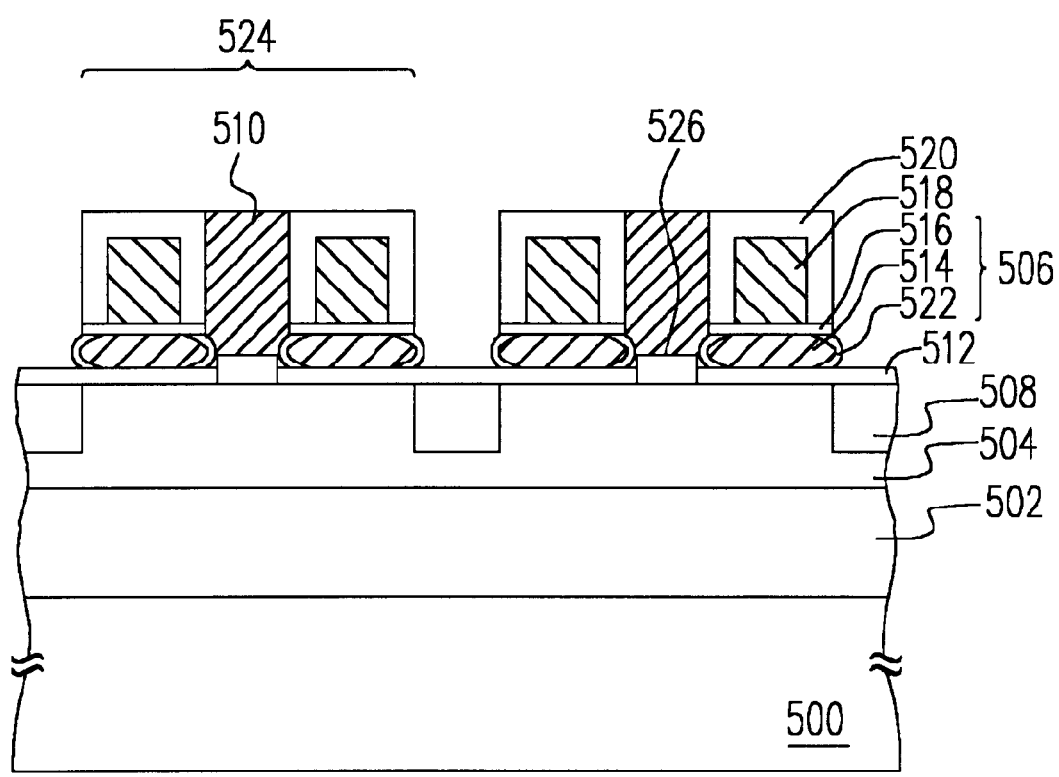
FIG. 5 is a cross-sectional view of a flash memory device structure according to this invention.

FIG. 5 is a cross-sectional view of a flash memory device structure according to this invention. As shown in FIG. 5, each flash memory device at least comprises of a P-type substrate 500, a deep N-well region 502, an isolating P-well region 504, a gate structure 506, an N-type source/drain region 508 and a select gate 510. The gate structure 506 further includes a tunneling oxide layer 512, a floating gate 514, a gate dielectric layer 516, a control gate 518 and spacers 520, 522.

The deep N-well region 502 is located within the P-type substrate 500 and the isolating P-well region 504 is located within the deep N-well region 502. The gate structure 506 is positioned over the P-type substrate 500. Each pair of neighboring gate structures 506 constitutes a gate structure unit 524. The N-type source/drain regions are located in the P-type well region 504 on each side of the gate structure unit 524. The select gate 510 is located within the gate structure unit 524 between the two gate structures 506. A select gate oxide layer 526 is located between the select gate 510 and the substrate 500. The spacer 520 is on the sidewalls and the upper section of the control gate 518. The spacer 522 is on the sidewalls of the floating gate 514.

In this invention, each pair of neighboring gate structures 506 (memory cells) uses a single select gate 510. Hence, overall level of integration of the flash memory is increased.

Figure 6:
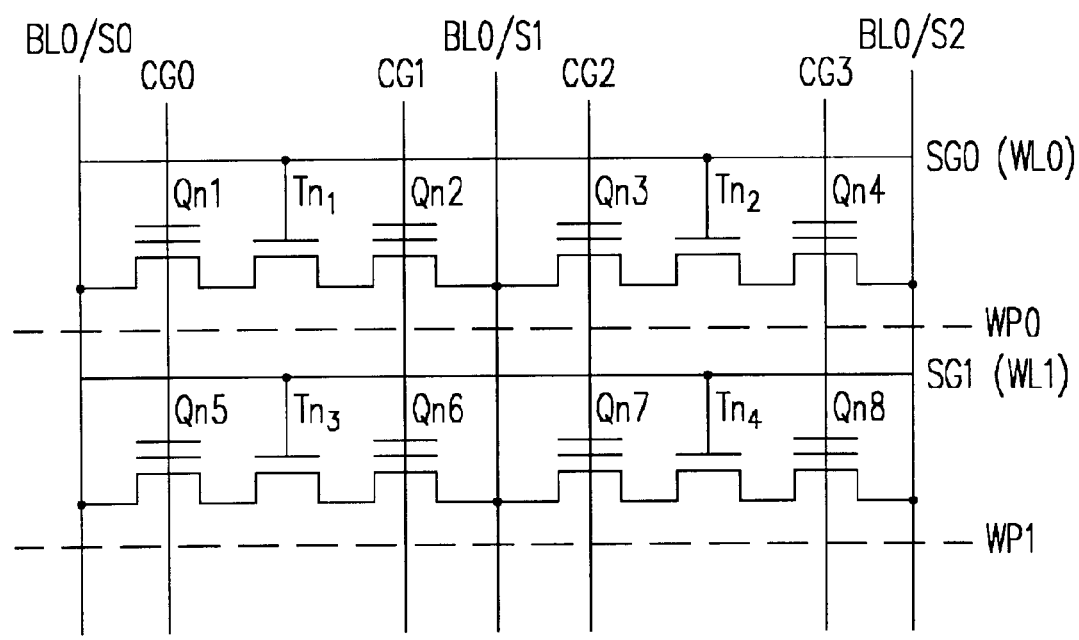
FIG. 6 is a simplified circuit diagram of the flash memory according to this invention.

FIG. 6 is a simplified circuit diagram of the flash memory according to this invention. In FIG. 6, a plurality of memory cells Qn1 to Qn8, select transistors Tn1 to Tn4, isolating P-well regions PW0 to PW1, bit line/source line BL0/S0 to BL2/S2, control gate lines CG0 to CG3 and select gate lines (word lines) SG0 (WL0) to SG1 (WL1). The memory cells are grouped together by pairs into memory cell structure units with each memory cell structure unit having two neighboring memory cells and a select transistor. The select transistor is set up between two neighboring memory cells. The memory cell structure units are joined together as a column/row array such that each pair of neighboring memory cells using the same source/drain region. In each row, the source/drain region of each memory cell in various memory cell structure units is electrically connected to a corresponding bit line/source line. Similarly, in each column, the control gate of various memory cells is electrically connected to a corresponding control gate line. Furthermore, the isolating P-well region of various memory cells within each row is electrically connected together and the gate of the select transistors within each row is electrically connected to a corresponding select gate line (word line).

For example, in the same row, the memory cell Qn1, the select transistor Tn1 and the memory cell Qn2 form a structural unit, the memory cell Qn3, the select transistor Tn2 and the memory cell Qn4 form a second structural unit, the memory cell Qn5, the select transistor Tn3 and the memory cell Qn6 forms a third structural unit, and the memory cell Qn7, the select transistor Tn4 and the memory cell Qn8 form a fourth structural unit. The source/drain terminals of the memory cells Qn1 and Qn5 are coupled to the bit line/source line BL0/S0. The source/drain terminal of the memory cells Qn2, Qn3, Qn6 and Qn7 are coupled to the bit line/source line BL1/S1. The source/drain terminal of the memory cells Qn4 and Qn8 are coupled to the bit line/source line BL2/S2. The control gate line CG0 is connected to the control gate of the memory cells Qn1 and Qn5. The control gate line CG1 is connected to the control gate of the memory cells Qn2 and Qn6. The control gate line CG2 is connected to the control gate of the memory cells Qn3 and Qn7. The control gate line CG3 is connected to the control gate of the memory cells Qn4 and Qn8. The select gate line (word line) SG0 (WL0) is connected to the gate of the select transistors Tn1 and Tn2. The select gate line (word line) SG1 (WL1) is connected to the gate of the select transistors Tn3 and Tn4. The memory cells Qn1, Qn2, Qn3 and Qn4 are electrically connected to the isolating P-well region PW0. Similarly, the memory cells Qn5, Qn6, Qn7 and Qn8 are electrically connected to the isolating P-well region PW1.

The memory cell array according to this invention has a setup that group each pair of neighboring memory cells together and hence each pair of memory cells uses a single select transistor (select gate). Therefore, average size of each memory cell can be reduced. With this structural design, the memory cell array has dimension-reducing capacity similar to a conventional NAND type memory cell array so that overall level of integration is increased.

Figure 7A:
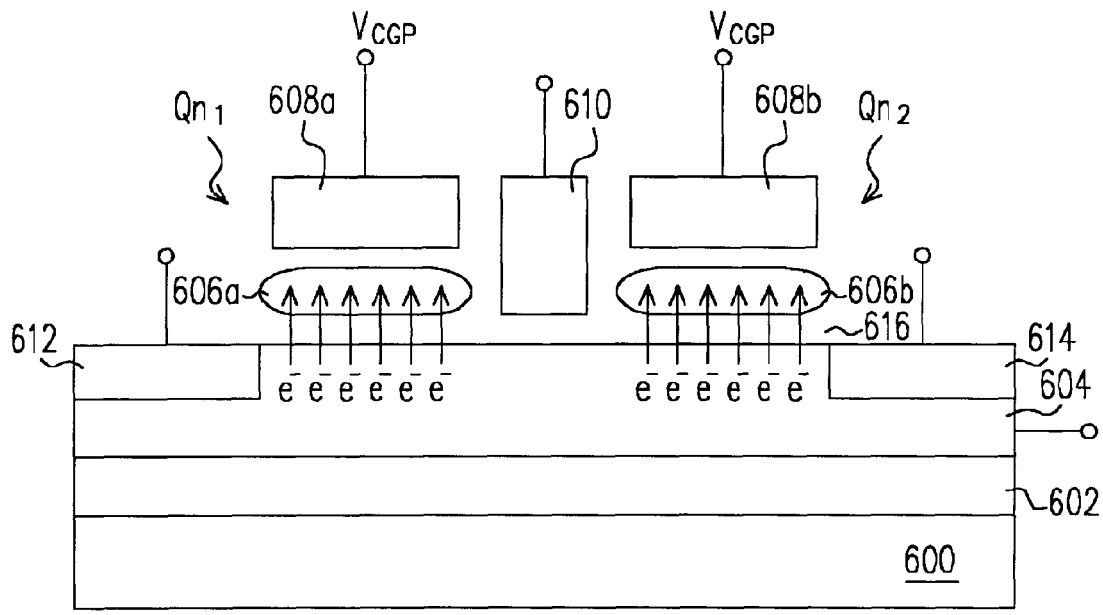
FIG. 7A is a sectional view showing the programming mode of the flash memory according to this invention.
Figure 7B:
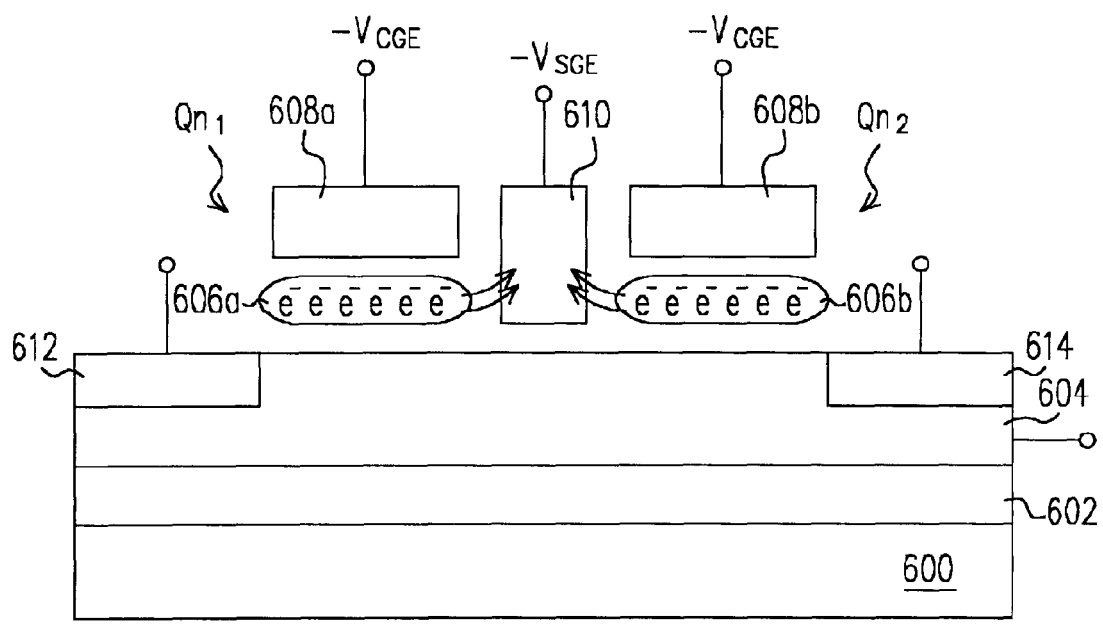
FIG. 7B is a sectional view showing the erasing mode of the flash memory according to this invention.

FIG. 7A is a sectional view showing the programming mode of the flash memory according to this invention. FIG. 7B is a sectional view showing the erasing mode of the flash memory according to this invention. In the following, the programming mode (in FIG. 7A), the read mode and the erasing mode (in FIG. 7B) of the flash memory according to this invention are illustrated using the memory cells Qn1 and Qn2 in FIG. 6 as an example.

To program the memory cell Qn1, a positive bias voltage VCGp of about 10V to 12V is applied to the control gate 606a (CG0), a negative bias voltage VPWp of about 6V to 8V is applied to the P-well region 604. Meanwhile, the source/drain region 612 (BL0/S0), the source/drain region 614 (BL1/S1) remains in a floating state and the select gate 610 (SG0) is at 0V. Hence, a large electric field is established between the floating gate 606a and the substrate 600. Through the F-N tunneling effect, electrons penetrate the tunneling oxide layer 616 into the floating gate 606a. Similarly, to program the memory cell Qn2, a positive bias voltage VCGp of about 10V to 12V is applied to the control gate 606b (CG1), a negative bias voltage VPWp of about 6V to 8V is applied to the P-well region 604. Meanwhile, the source/drain region 612 (BL0/S0), the source/drain region 614 (BL1/S1) remains in a floating state and the select gate 610 (SG0) is at 0V. Hence, a large electric field is established between the floating gate 606b and the substrate 600. Through the F-N tunneling effect, electrons penetrate the tunneling oxide layer 616 into the floating gate 606b as shown in FIG. 7A.

When the aforementioned programming operation is being executed, the memory cells Qn5 and Qn6 will not be programmed because the isolating P-well region (PW1) is at 0V. Since there is no F-N tunneling effect in the memory cells Qn5 and Qn6, no data is programmed into the cells.

In addition, the control gate line CG2 connecting the memory cells Qn3 and Qn7 and the control gate line CG3 connecting the memory cells Qn4 and Qn8 are at 0V. Therefore, no F-N tunneling effect will occur in the memory cells Qn3, Qn4, Qn7 and Qn8.

To read data from the memory cell Qn1, a bias voltage Vd of about 1V to 1.5V is applied to the source/drain region 612 (BL0/S0), a bias voltage Vcc of about 3.3V is applied to the select gate 610 (SG0(WL0)) and the control gate 608a (CG0), a bias voltage VCGR of about 10V is applied to the control gate 608b (CG1), the source/drain region 614 (BL1/

S1) and the isolating P-well region 604 (PW0) is connected to a ground potential. Similarly, to read data from the memory cell Qn2, a bias voltage Vd of about 1V to 1.5V is applied to the source/drain region 614 (BL1/S1), a bias voltage Vcc of about 3.3V is applied to the select gate 610 (SG0(WL0)) and the control gate 608b (CG1), a bias voltage VCGR of about 10V is applied to the control gate 608a (CG0), the source/drain region 612 (BL0/S0) and the isolating P-well region 604 (PW0) is connected to a ground potential. In general, the channel of the memory cell having electric charges trapped inside the floating gate is shut with little current while the channel of the memory cell having no electric charges inside the floating gate is open with large current. Hence, size of current flowing the channel of the memory cell can be used to determine whether a data bit of "1" or a "0" is stored in the flash memory.

To erase data from the memory cells Qn1 and Qn2, a zero voltage is applied to the control gate 608a (CG0) and the control gate 608b (CG1) and a positive bias voltage VSGE of about 10V to 12V is applied to the select gate 610 (SG0). Meanwhile, the source/drain region 612 (BL0/S0), the source/drain region 614 (BL1/S1) and the isolating P-well region (PW1) remain in a floating state. With this voltage setup, a large electric field is established between the floating gate 606a, the floating gate 606b and the select gate 610. Through the F-N tunneling effect, electrons will pull out from the floating gates 606a and 606b into the select gate as shown in FIG. 7B.

In the aforementioned erasing operation, the select transistor Tn1 between the memory cells Qn1 and Qn2 as well as the select transistor Tn2 between the memory cells Qn3 and Qn4 use the same select gate line (word line) SG0 (WL0). Therefore, the data inside the memory cells Qn3 and Qn4 on the same page as the memory cells Qn1 and Qn2 will be erased when the data in the memory cells Qn1 and Qn2 is erased. In the meantime, since the common select line (word line) SG1 (WL1) connecting the select transistor Tn3 between the memory cells Qn5 and Qn6 and the select transistor Tn4 between the memory cells Qn7 and Qn8 receives no bias voltage, no F-N tunneling occurs in the memory cells Qn5, Qn6, Qn7 and Qn8 to wipe out the stored data. In other words, the data within a page can be erased through F-N tunneling effect by applying a bias voltage of about 10V to 12V to the select gate (word line) of the desired page while maintaining a 0V at the control gate line.

In addition, the flash memory device of this invention has an isolating P-well region buried inside the deep N-well region. Therefore, by applying a suitable bias voltage to the control gate and the isolating P-well region in a programming step, F-N tunneling is activated to inject electrons from the substrate (isolating P-well region) to the floating gate through the tunneling oxide layer. Thus, subsequent programming of data into the second memory cell Qn2 is little affected by the previous programming into the first memory cell Qn1. In other words, unsymmetrical programming problems are prevented. Furthermore, the memory cells Qn1 and Qn2 can be programmed simultaneously by applying a positive bias voltage VCGp to both the control gate 606a (CG0) and the control gate 606b (CG1), applying a negative bias voltage VPWp to the P-well region 604 (PW0) while maintaining the source/drain region 612 (BL0/S0) and the source/drain region 614 (BL1/S1) at a floating state and setting the select gate610 (SG0) at 0V.

Because F-N tunneling effect is utilized to program the flash memory device of this invention, electron injection efficiency is relatively high. Hence, memory cell current for conducting data programming can be reduced while overall operating speed of the memory device can be increased. Furthermore, both programming and erasing are carried out using the F-N tunneling effect, which requires very little current. Therefore, overall power consumption of the memory device is reduced. Moreover, the method also permits parallel and large page-wise data programming or erasing.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of operating a flash memory device, wherein the flash memory device includes a P-type substrate, an N-type well region within the P-type substrate, a P-well region within the N-well region, a first memory cell and a second memory cell over the P-type substrate wherein the first memory cell has a first control gate and the second memory cell has a second control gate, a select gate between the first memory cell and the second memory cell, a first source/drain region and a second source/drain region in the P-well region on one side of the first memory cell and the second memory cell respectively, and the first source/drain region and the second source/drain region are N-type regions, the method comprising the steps of:

programming data into the first memory cell of the flash memory device includes:

applying a first positive voltage to the first control gate, applying a first negative voltage to the P-well region, connecting the select gate to ground and setting the first source/drain region and the second source/drain region in a floating state so that F-N tunneling effect is activated to program data into the first memory cell;

reading data from the first memory cell of the flash memory device includes:

applying a second positive voltage to the select gate, applying the second positive voltage to the first control gate, applying a third positive voltage to the second control gate, applying a fourth positive voltage to the second source/drain region and setting the first source/drain region and the P-well region in a floating state so that data can be read from the first memory cell; and erasing data from the first memory device of the flash memory device, includes:

applying a fifth positive voltage to the select gate, setting the first control gate and the second control gate to 0V and setting the first source/drain region and the second source/drain region to a floating state so that F-N tunneling effect is activated to erase data from the flash memory device.

2. The method of operating the flash memory device of claim 1, wherein the method may further include:

programming data into the second memory cell of the flash memory device, includes:

applying the first positive voltage to the second control gate, applying the first negative voltage to the P-well region, connecting the select gate to ground and setting the first source/drain region and the second source/drain region to a floating state so that F-N tunneling effect is activated to program data into the second memory cell.

3. The method of operating the flash memory device of claim 1, wherein data is also erased from the second memory cell when the data in the first memory data cell is erased.

4. The method of operating the flash memory device of claim 1, wherein the first positive voltage is between about 10V to 12V.

5. The method of operating the flash memory device of claim 1, wherein the first negative voltage is between about 6V to 8V.

6. The method of operating the flash memory device of claim 1, wherein the second positive voltage is about 3.3V.

7. The method of operating the flash memory device of claim 1, wherein the third positive voltage is about 10V.

8. The method of operating the flash memory device of claim 1, wherein the fourth positive voltage is between about 1V to 1.5V.

9. The method of operating the flash memory device of claim 1, wherein the fifth positive voltage is between about 10V to 12V.

* * * * *